United States Patent
Onodera et al.

(10) Patent No.: US 9,929,770 B2
(45) Date of Patent: Mar. 27, 2018

(54) RADIO-FREQUENCY MODULE

(71) Applicant: Murata Manufacturing Co., Ltd., Nagaokakyo-shi, Kyoto-fu (JP)

(72) Inventors: Syuichi Onodera, Nagaokakyo (JP); Koichi Ueno, Nagaokakyo (JP); Naoya Matsumoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/390,880

(22) Filed: Dec. 27, 2016

(65) Prior Publication Data
US 2017/0111078 A1    Apr. 20, 2017

Related U.S. Application Data

(63) Continuation of application No. PCT/JP2015/068750, filed on Jun. 30, 2015.

(30) Foreign Application Priority Data

Jul. 1, 2014    (JP) ................................ 2014-135783

(51) Int. Cl.
*H03H 9/46*    (2006.01)
*H04B 1/44*    (2006.01)
(Continued)

(52) U.S. Cl.
CPC ................. *H04B 1/44* (2013.01); *H03H 9/64* (2013.01); *H04M 1/0202* (2013.01);
(Continued)

(58) Field of Classification Search
CPC ........ H03H 2/005; H03H 2/006; H03H 2/008; H03H 9/46; H03H 9/48; H03H 9/66;
(Continued)

(56) References Cited

U.S. PATENT DOCUMENTS 8,970,320 B2 *    3/2015    Iwaki .................... H03H 9/0542
                                                                    333/126
2009/0147707 A1    6/2009    Koga et al.
(Continued)

FOREIGN PATENT DOCUMENTS

JP    2006-100680 A    4/2006
JP    2012-109818 A    6/2012
(Continued)

OTHER PUBLICATIONS

Official Communication issued in corresponding International Application PCT/JP2015/068750, dated Aug. 11, 2015.

*Primary Examiner* — Duc M Nguyen
(74) *Attorney, Agent, or Firm* — Keating & Bennett, LLP

(57) ABSTRACT

An inductor that adjust characteristics of a transmit filter circuit is disposed so that the inductor and at least one of common paths, a matching circuit, a receive filter circuit, and receive paths connected to an output terminal of the transmit filter circuit define a propagation path due to magnetic-field coupling and/or electric-field coupling. This configuration does not require the addition of a circuit device to define the propagation path. It is thus possible to improve attenuation characteristics for an RF signal outside the frequency band of a transmitting signal and to improve isolation characteristics between a transmit filter circuit and a receive filter circuit without increasing the size of a radio-frequency module.

20 Claims, 10 Drawing Sheets

(51) Int. Cl.
*H03H 9/64* (2006.01)
*H04M 1/02* (2006.01)
*H03H 11/16* (2006.01)
*H03H 2/00* (2006.01)

(52) U.S. Cl.
CPC ............... *H03H 2/005* (2013.01); *H03H 9/46* (2013.01); *H03H 11/16* (2013.01)

(58) Field of Classification Search
CPC ........ H03H 9/706; H03H 11/16; H03H 11/18; H03H 11/20; H01P 1/22
See application file for complete search history.

(56) References Cited

U.S. PATENT DOCUMENTS

| 2010/0150075 | A1* | 6/2010 | Inoue | H03H 9/725 370/328 |
| 2010/0244979 | A1* | 9/2010 | Matsuda | H03H 9/0571 333/100 |
| 2011/0254639 | A1* | 10/2011 | Tsutsumi | H01P 1/213 333/132 |
| 2012/0119847 | A1 | 5/2012 | Iwaki et al. | |
| 2012/0293276 | A1* | 11/2012 | Iwaki | H03H 9/0038 333/133 |
| 2013/0113576 | A1* | 5/2013 | Inoue | H03H 9/6433 333/133 |
| 2015/0137909 | A1* | 5/2015 | Okuda | H03H 9/0576 333/133 |
| 2016/0028365 | A1* | 1/2016 | Takeuchi | H04B 1/18 333/133 |
| 2017/0155376 | A1* | 6/2017 | Yamaguchi | H03H 9/64 |

FOREIGN PATENT DOCUMENTS

| WO | 2007/102560 A1 | 9/2007 |
| WO | 2014/034373 A1 | 3/2014 |

* cited by examiner

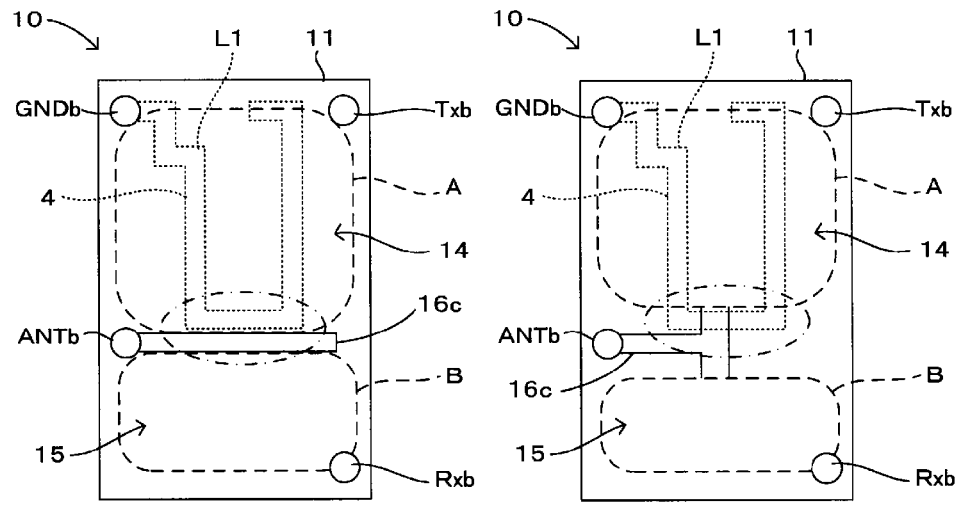
FIG. 3A    FIG. 3B
FIG. 4
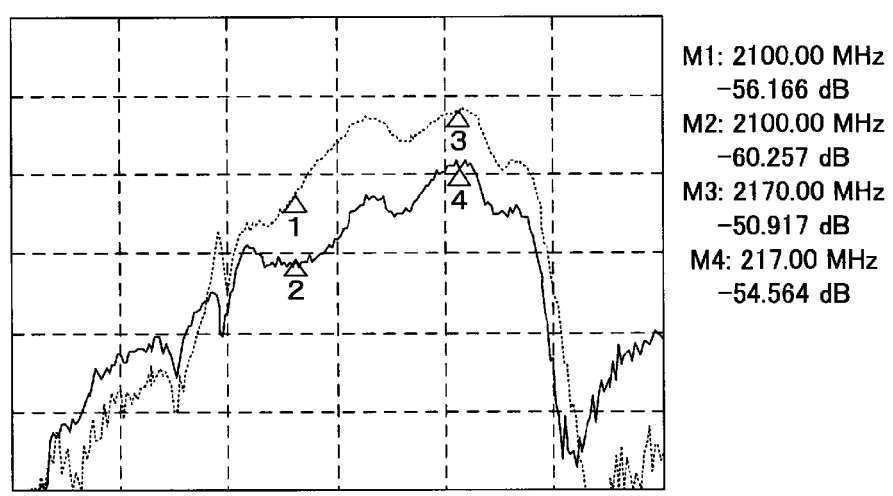
M1: 2100.00 MHz
−56.166 dB
M2: 2100.00 MHz
−60.257 dB
M3: 2170.00 MHz
−50.917 dB
M4: 217.00 MHz
−54.564 dB

RADIO-FREQUENCY MODULE

CROSS REFERENCE TO RELATED APPLICATIONS

This application claims the benefit of priority to Japanese Patent Application No. 2014-135783 filed on Jul. 1, 2014 and is a Continuation Application of PCT Application No. PCT/JP2015/068750 filed on Jun. 30, 2015. The entire contents of each application are hereby incorporated herein by reference.

BACKGROUND OF THE INVENTION

1. Field of the Invention

The present invention relates to a radio-frequency module that separates a transmitting signal and a received signal.

2. Description of the Related Art

Hitherto, a radio-frequency module including a filter circuit has been provided. For example, a filter circuit 500 shown in FIG. 15 is mounted on a radio-frequency module (see, for example, Japanese Unexamined Patent Application Publication No. 2012-109818. The filter circuit 500 includes a filter unit 503 and a path 504. The filter unit 503 is connected between an input terminal 501 and an output terminal 502. The path 504 is connected in parallel with the filter unit 503. In this configuration, a signal path for allowing a RF (Radio Frequency) signal input into the input terminal 501 to pass therethrough is split into a path of the filter unit 503 and the path 504. When an RF signal is input into the input terminal 501, a first signal 505 passes through the filter unit 503, while a second signal 506 passes through the path 504. Then, the first signal 505 passing through the filter unit 503 and the second signal 506 passing through the path 504 are combined, and the resulting RF signal is output from the output terminal 502.

The filter unit 503 is defined by a band pass filter in which a predetermined pass band is set. The filter unit 503 allows an RF signal in the pass band to pass therethrough and attenuates an RF signal outside the pass band. However, the mere use of the filter unit 503 may not be sufficient to attenuate an RF signal outside the pass band to a desired value. Thus, a correction circuit defined by an inductor and a capacitor is provided in the path 504. The impedance of the path 504 is set so that the phase of the second signal 506 outside the pass band of the filter unit 503 which passes through the path 504 will be opposite in a frequency band outside the pass band of the filter unit 503 to the phase of the first signal 505 which passes through the filter unit 503 and which is desired to be attenuated further and so that the amplitude of the first signal 505 will be the same as that of the second signal 506 in a frequency band outside the pass band of the filter unit 503.

At a node between the signal line on the output side of the filter unit 503 and that of the path 504, the first signal 505 that has passed through the filter unit 503 and the second signal 506 that has passed through the path 504 cancel each other out in a frequency band outside the pass band of the filter unit 503, thereby attenuating an RF signal in this frequency band output from the output terminal 502. This can improve the attenuation characteristics for an RF signal outside the pass band of the filter circuit 500. Additionally, another filter circuit defined by a band pass filter, the pass band of which is different from that of the filter circuit 500, may be disposed adjacent to the filter circuit 500. In this case, it is possible to reduce the possibility that an RF signal outside the pass band of the filter circuit 500 output from the output terminal 502 will enter this adjacent filter circuit. This improves isolation characteristics between the filter circuit 500 and the adjacent filter circuit.

In order to improve the attenuation characteristics for an RF signal outside a predetermined pass band, the above-described known filter circuit 500 requires, in addition to the filter unit 503, the path 504 including a correction circuit to generate an RF signal of opposite phase to an RF signal outside the pass band passing through the filter unit 503. The provision of the path 504 increases the size of the filter circuit 500 and accordingly increases the size of a radio-frequency module including the filter circuit 500.

SUMMARY OF THE INVENTION

Preferred embodiments of the present invention provide a technology for improving attenuation characteristics for an RF signal outside a frequency band of a transmitting signal input into a transmit electrode and for improving isolation characteristics between a transmit filter circuit and a receive filter circuit without increasing the size of a radio-frequency module.

A radio-frequency module according to a preferred embodiment of the present invention includes a transmit electrode into which a transmitting signal is input; a common electrode from which the transmitting signal is output and into which a received signal is input; a receive electrode from which the received signal is output; a separator including a transmit filter circuit and a receive filter circuit, a frequency band of the transmitting signal being set in the transmit filter circuit as a pass band, a frequency band of the received signal being set in the receive filter circuit as a pass band, the frequency band of the received signal being different from the frequency band of the transmitting signal; a transmit path that connects the transmit electrode and an input terminal of the transmit filter circuit; a receive path that connects the receive electrode and an output terminal of the receive filter circuit; a common path that connects the common electrode and each of an output terminal of the transmit filter circuit and an input terminal of the receive filter circuit; a matching circuit connected to the common path; and an inductor that adjusts characteristics of the transmit filter circuit, one end of the inductor being connected to the transmit filter circuit, the other end of the inductor being connected to a ground electrode. The inductor is disposed so that the inductor and at least one of the common path, the matching circuit, the receive filter circuit, and the receive path define a propagation path connected to a signal path at the output terminal of the transmit filter circuit due to magnetic-field coupling and/or electric-field coupling.

In the present preferred embodiment of the present invention configured as described above, the matching circuit is connected to the common path that connects the common electrode and each of the output terminal of the transmit filter circuit and the input terminal of the receive filter circuit. One end of the inductor that adjusts characteristics of the transmit filter circuit is connected to the transmit filter circuit, and the other end of the inductor is connected to the ground electrode. The inductor is disposed so that the inductor connected to the transmit filter circuit and at least one of the common path, the matching circuit, the receive filter circuit, and the receive path connected to the output terminal of the transmit filter circuit define a propagation path connected to a signal line at the output terminal of the transmit filter circuit due to magnetic-field coupling and/or electric-field coupling (hereinafter magnetic-field coupling and/or electric-field coupling may also be called "being electromagnetically coupled" or "being connected in a radio-frequency range"). With this configuration, RF signals including a transmitting signal input into the transmit electrode pass through the transmit filter circuit and the propagation path, and are then combined in the signal path at the output terminal of the transmit filter circuit connected to the propagation path.

The degree of magnetic-field coupling and/or electric-field coupling that define the propagation path, which is diverted from the transmit filter circuit, is adjusted so that the phase characteristics in a range outside the frequency band of a transmitting signal which passes through the propagation path will differ from those in a range outside the frequency band of a transmitting signal which passes through the transmit filter circuit. With this adjustment, an RF signal outside the frequency band of a transmitting signal which passes through the transmit filter circuit and an RF signal outside the frequency band of a transmitting signal which passes through the propagation path cancel each other out and are attenuated when they are combined.

In comparison with a known configuration in which circuit devices such as an inductor and a capacitor are added to define a correction circuit, a propagation path that improves the filter characteristics is able to be provided with a simple configuration. It is thus possible to improve attenuation characteristics in a range outside the frequency band of a transmitting signal without increasing the size of the radio-frequency module. It is also possible to reduce the possibility that an RF signal of a frequency band which is outside the frequency band of a transmitting signal and which is substantially the same as the frequency band of a received signal will enter the receive filter circuit from the signal path at the output terminal of the transmit filter circuit and be output from the receive electrode. This enhances isolation characteristics between the transmit filter circuit and the receive filter circuit.

The radio-frequency module may further include a module substrate on which the transmit electrode, the receive electrode, and the common electrode are disposed, on or in which the matching circuit are disposed, and on which the separator is mounted. The inductor may include a wiring electrode provided in or on the module substrate, and the wiring electrode defining the inductor may be disposed right under the separator without the ground electrode disposed between the wiring electrode and the separator, as viewed from above.

This configuration makes it possible to electromagnetically couple the inductor provided in or on the module substrate with the common path, the receive path, and the receive filter circuit disposed within the separator.

The wiring electrode defining the inductor may be disposed on a mounting surface of the module substrate.

With this configuration, the distance between the inductor and the separator becomes smaller. This achieves more reliable electromagnetic coupling between the inductor provided in or on the module substrate with the common path, the receive path, and the receive filter circuit disposed within the separator.

The wiring electrode defining the inductor may be disposed so as to overlap or be adjacent to at least the common path within the separator as viewed from above.

This configuration makes it possible to electromagnetically couple the inductor provided in or on the module substrate with the common path within the separator, and thus to connect the resulting propagation path to the common path. Thus, immediately after an RF signal outside the frequency band of a transmitting signal is output from the output terminal of the transmit circuit filter, the RF signal is suppressed and attenuated in the common path. This further improves isolation characteristics between the transmit filter circuit and the receive filter circuit.

The matching circuit may include a wiring electrode provided in or on the module substrate, and the wiring electrode defining the matching circuit may be disposed so as to overlap the wiring electrode defining the inductor as viewed from above.

This configuration makes it possible to electromagnetically couple the matching circuit and the inductor. This configuration also reduces the size of the module substrate, compared with a modulate substrate on which a matching circuit including a chip component is mounted near the separator. The size of the radio-frequency module is reduced accordingly.

The radio-frequency module may further include a module substrate on which the transmit electrode, the receive electrode, and the common electrode are disposed, on or in which the matching circuit are disposed, and on which the separator is mounted. The inductor may be a chip inductor component and be mounted on a mounting surface of the module substrate so as to be adjacent to a common terminal electrode of the separator.

This configuration makes it possible to electromagnetically couple the inductor with the common path connected to the common terminal electrode within the separator. This configuration also enables easier and more precise adjustment of the inductance of the inductor than that of an inductor defined by a wiring electrode provided in or on the module substrate. It is thus possible to more easily and more precisely adjust the attenuation characteristics of the transmit filter circuit and the degree of electromagnetic coupling that defines a propagation path that attenuates an RF signal outside the frequency band of a transmitting signal.

The radio-frequency module may further include a module substrate on which the transmit electrode, the receive electrode, and the common electrode are disposed, on or in which the matching circuit are disposed, and on which the separator is mounted. The inductor may include a chip inductor component and be mounted on a mounting surface of the module substrate. The matching circuit may include a chip circuit component and be mounted on the mounting surface of the module substrate. The chip inductor component and the chip circuit component may be disposed adjacent to each other.

This configuration enables easier and more precise adjustment of the inductance of the inductor than that of an inductor defined by a wiring electrode provided in or on the module substrate. This configuration also enables easier and more precise adjustment of the impedance characteristics of the matching circuit than that of a matching circuit defined by a wiring electrode provided in or on the module substrate. It is thus possible to more easily and more precisely adjust the attenuation characteristics of the transmit filter circuit and the degree of electromagnetic coupling that defines a propagation path that attenuates an RF signal outside the frequency band of a transmitting signal.

The radio-frequency module may further include a module substrate on which the transmit electrode, the receive electrode, and the common electrode are disposed, on or in which the matching circuit are disposed, and on which the separator is mounted. The inductor may include a wiring electrode provided in or on the module substrate. The matching circuit may include a chip circuit component and be mounted on a mounting surface of the module substrate.

The wiring electrode defining the inductor and the chip circuit component may be disposed so as to overlap each other as viewed from above.

This configuration makes it possible to electromagnetically couple the inductor and the chip circuit component defining the matching circuit.

The radio-frequency module may further include a module substrate on which the transmit electrode, the receive electrode, and the common electrode are disposed, on or in which the matching circuit are disposed, and on which the separator is mounted. The inductor may include a chip inductor component and be mounted on the mounting surface of the module substrate. The matching circuit may include a wiring electrode provided in or on the module substrate. The wiring electrode of the matching circuit and the chip inductor component may be disposed so as to overlap each other as viewed from above.

This configuration makes it possible to electromagnetically couple the inductor defined by the chip inductor component and the matching circuit.

The separator may include a cover layer, and the inductor may include a wiring electrode provided in or on the cover layer.

This configuration makes it possible to dispose the inductor more closely to the common path, the receive path, and the receive filter circuit disposed within the separator. This achieves more reliable electromagnetic coupling between the inductor and the common path, the receive path, and the receive filter circuit so that a propagation path is provided.

According to various preferred embodiments of the present invention, a propagation path that improves filter characteristics is provided a simple configuration. It is thus possible to improve attenuation characteristics in a range outside the frequency band of a transmitting signal without increasing the size of a radio-frequency module. It is also possible to reduce the possibility that an RF signal of a frequency band which is outside the frequency band of a transmitting signal and which is the same or substantially the same as the frequency band of a received signal will enter a receive filter circuit from a signal path at the output terminal of a transmit filter circuit and be output from a receive electrode. This enhances isolation characteristics between the transmit filter circuit and the receive filter circuit.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A and 3B are plan views illustrating positional relationships between a common path provided within a separator and an inductor disposed in a module substrate as viewed from above, wherein FIG. 3A illustrates a state in which the common path and the inductor are disposed adjacent to each other according to a preferred embodiment of the present invention, and FIG. 3B illustrates a state in which the common path and the inductor overlap each other according to a preferred embodiment of the present invention.

FIG. 4 is a graph illustrating isolation characteristics between a transmit filter circuit and a receive filter circuit according to a preferred embodiment of the present invention.

FIGS. 11A-11C illustrate the positional relationships between the matching circuit and an inductor provided in the module substrate and a separator wherein FIG. 11A through FIG. 11C illustrate different positional relationships according to preferred embodiments of the present invention.

DETAILED DESCRIPTION OF THE PREFERRED EMBODIMENTS

First Preferred Embodiment

Figure 1:
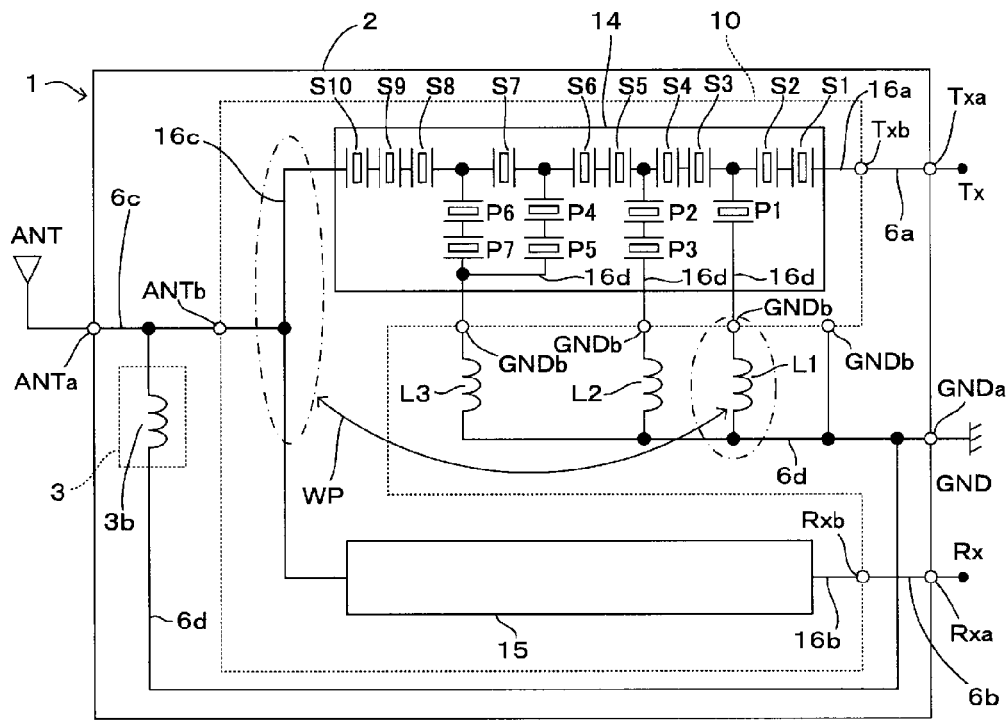
FIG. 1 is a circuit block diagram illustrating the electrical configuration of a radio-frequency module according to a first preferred embodiment of the present invention.
Figure 2:
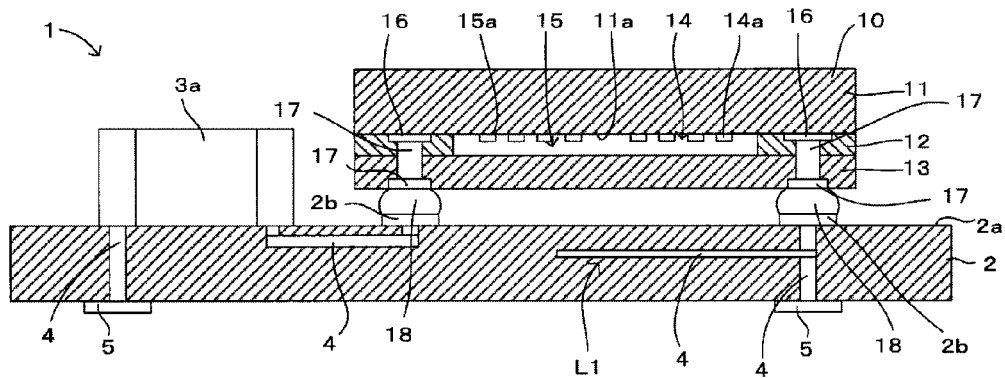
FIG. 2 illustrates an example of a sectional view of the structure of the radio-frequency module according to the first preferred embodiment of the present invention.

A first preferred embodiment of a radio-frequency module of the present invention will be described below with reference to FIGS. 1 through 4. FIG. 1 is a circuit block diagram of a radio-frequency module according to the first preferred embodiment of the present invention. FIG. 2 is a sectional view of the structure of the radio-frequency module shown in FIG. 1. FIGS. 3A and 3B are plan views illustrating the positional relationships between a common path provided within a separator and an inductor disposed in a module substrate as viewed from above. FIG. 3A illustrates a state in which the common path and the inductor are disposed adjacent to each other. FIG. 3B illustrates a state in which the common path and the inductor overlap each other. FIG. 4 is a graph illustrating isolation characteristics between a transmit filter circuit and a receive filter circuit.

FIGS. 1 through 3B illustrate the configuration of only major components according to a preferred embodiment of the present invention, and the configuration of the other components is not shown for the sake of simple representation. As well as FIGS. 1 through 3, the other drawings, which will be discussed later, also illustrate the configuration of only major components. This explanation will not be given in the following description.

A radio-frequency module 1 shown in FIGS. 1 and 2 is a module to be mounted on a mother substrate provided in a communication mobile terminal, such as a cellular phone and a mobile information terminal. In this preferred embodiment, the radio-frequency module 1 includes a separator 10 (duplexer) in which a transmit filter circuit 14 and a receive filter circuit 15 are provided, a module substrate 2, a matching circuit 3, and various electronic components (not shown) such as a switch IC, a filter, a resistor, a capacitor, and a coil. The radio-frequency module 1 is defined by a radio-frequency antenna switch module.

The separator 10, a chip circuit component 3a to define the matching circuit 3, and various other electronic components are mounted on mounting electrodes 2b disposed on a mounting surface 2a of the module substrate 2 and are electrically connected to plural mounting electrodes 5 and other electronic components on the back surface of the module substrate 2 via wiring electrodes 4 provided in the module substrate 2. A transmit electrode Txa into which a transmitting signal is input from the outside, a common electrode ANTa from which this transmitting signal is output to the outside and into which a received signal is received from the outside, a receive electrode Rxa from which the received signal input into the common electrode ANTa is output to the outside, and a ground electrode GNDa connected to a ground path GND are defined by the mounting electrodes 5.

In the mother substrate provided in a communication mobile terminal, wiring electrodes corresponding to various signal paths such as a common path, a ground path, a transmit path, and a receive path are provided. As a result of mounting the radio-frequency module 1 on the mother substrate, these wiring electrodes are connected to the common electrode ANTa, the ground electrode GNDa, the transmit electrode Txa, and the receive electrode Rxa, so that a transmitting signal and a received signal is able to be input and output between the mother substrate and the radio-frequency module 1.

In this preferred embodiment, the module substrate 2 is defined by plural dielectric layers. As a result of suitably providing via-conductors and in-planar conductor patterns in or on the dielectric layers, the mounting electrodes 5 and the wiring electrodes 4 that connect the separator 10, the circuit component 3a, and various electronic components mounted on the module substrate 2 are provided in or on the module substrate 2. That is, as a result of providing the wiring electrodes 4 and the mounting electrodes 5 by suitably providing in-planar conductor patterns and via-conductors in or on the dielectric layers, the separator 10, the circuit component 3a, and various electronic components mounted on the module substrate 2 are electrically connected to the mounting electrodes 5. In this case, in-planar conductor patterns and via-conductors provided in or on the dielectric layers may define circuit devices such as capacitors and inductors. These circuit devices such as capacitors and inductors may define a filter circuit and the matching circuit 3.

In this preferred embodiment, the matching circuit 3 is defined by an inductor 3b within the chip circuit component 3a mounted on the mounting surface 2a of the module substrate 2. More specifically, one end of the inductor 3b is connected to a substrate common path 6c which connects a common terminal electrode ANTb of the separator 10 and the common electrode ANTa of the module substrate 2. The other end of the inductor 3b is connected to the ground electrode GNDa via a substrate ground path 6d provided in the module substrate 2. With this configuration, the matching circuit 3 is provided.

The substrate common path 6c is defined by a wiring electrode 4 provided in the module substrate 2. The matching circuit 3 is not restricted to the configuration shown in FIG. 1. The matching circuit 3 may be defined by replacing the inductor 3b shown in FIG. 1 by a capacitor. The matching circuit 3 may be provided by connecting an inductor or a capacitor in series with the substrate common path 6c which connects the common electrode ANTa and the common terminal electrode ANTb. Alternatively, the matching circuit 3 may be provided by a combination of an inductor and a capacitor. That is, the circuit configuration of the matching circuit 3 in the radio-frequency module 1 may be any configuration that is commonly used to provide impedance matching between a circuit device such as an antenna to be connected to the common electrode ANTa and the common terminal electrode ANTb of the separator 10.

In the module substrate 2, inductors L1, L2, and L3 that adjust the characteristics of the filter circuit 14 are provided. One end of each of the inductors L1, L2, and L3 is connected to the transmit filter circuit 14, while the other ends thereof are connected to the ground electrode GNDa. A detailed description of the connection state of each of the inductors L1, L2, and L3 and the transmit filter circuit 14 will be given later.

The separator 10 preferably has a wafer-level packaging (WLP) structure. The separator 10 includes a device substrate 11 preferably with a rectangular or substantially rectangular shape as viewed from above, an insulating layer 12, a cover layer 13, the transmit filter circuit 14, and the receive filter circuit 15. The pass band for RF signals of the transmit filter circuit 14 is different from that of the receive filter circuit 15. In a predetermined region of one main surface 11a of the device substrate 11, a transmit SAW filter device 14a of the transmit filter circuit 14 and a receive SAW filter device 15a of the receive filter circuit 15 are provided.

On the main surface 11a of the device substrate 11, terminal electrodes 16 connected to interdigital electrodes and reflectors which define the transmit SAW filter device 14a and the receive SAW filter device 15a are provided. Electrodes 17 which pass through the insulating layer 12 are connected to the respective terminal electrodes 16. The electrodes 17 exposed on the main surface of the cover layer 13 define a transmit terminal electrode Txb, a receive terminal electrode Rxb, the common terminal electrode ANTb, and plural ground terminal electrodes GNDb. The input terminal of the transmit filter circuit 14 (transmit SAW filter device 14a) and the transmit terminal electrode Txb are connected to each other by a separator transmit path 16a. The output terminal of the receive filter circuit 15 (receive SAW filter device 15a) and the receive terminal electrode Rxb are connected to each other by a separator receive path 16b. The output terminal of the transmit filter circuit 14 and the input terminal of the receive filter circuit 15 are connected to the common terminal electrode ANTb by a separator common path 16c. Resonators defined by the interdigital electrodes (IDT electrodes) and the reflectors defining the SAW filter devices 14a and 15a are connected to the ground terminal electrodes GNDb by separator ground paths 16d.

The separator transmit path 16a, the separator receive path 16b, the separator common path 16c, and the separator ground paths 16d are defined by wiring electrodes (not shown) and the terminal electrodes 16 on the main surface 11a of the device substrate 11.

The insulating layer 12 surrounds a predetermined region of the main surface 11a of the device substrate 11 where the interdigital electrodes and reflectors are disposed.

The cover layer 13 is disposed on the insulating layer and defines, together with the insulating layer 12, a surrounded space between the cover layer 13 and the device substrate 11. The transmit SAW filter device 14a and the receive SAW filter device 15a are disposed within this space.

The separator 10 is mounted on the electrodes 2b provided on the mounting surface 2a by using a bonding material 18, such as a solder, such that the cover layer 13 opposes the mounting surface 2a of the module substrate 2. With this mounting operation, the transmit electrode Txa of the module substrate 2 and the transmit terminal electrode Txb of the separator 10 are connected to each other by a substrate transmit path 6a, and also, the transmit electrode Txa and the input terminal of the transmit filter circuit 14 are connected to each other via the transmit terminal electrode Txb. The receive electrode Rxa of the module substrate 2 and the receive terminal electrode Rxb of the separator 10 are connected to each other by a substrate receive path 6b, and also, the receive electrode Rxa and the output terminal of the receive filter circuit 15 are connected to each other via the receive terminal electrode Rxb. The common electrode ANTa of the module substrate 2 and the common terminal electrode ANTb of the separator 10 are connected to each other by the substrate common path 6c, and also, the common electrode ANTa is connected to the output terminal of the transmit filter circuit 14 and the input terminal of the receive filter circuit 15 via the common terminal electrode ANTb. The ground electrode GNDa of the module substrate 2 and the ground terminal electrodes GNDb of the separator 10 are connected to each other by the substrate ground line 6d, and also, the ground electrode ANTa and the grounding portions of the filter circuits 14 and 15 are connected to each other via the corresponding ground terminal electrodes GNDb.

The substrate transmit path 6a, the substrate receive path 6b, the substrate common path 6c, and the substrate ground path 6d are defined by the wiring electrodes 4 provided in or on the module substrate 2. The substrate transmit path 6a and the separator transmit path 16a define a "transmit path" according to a preferred embodiment of the present invention that connects the transmit electrode Txa and the input terminal of the transmit filter circuit 14. The substrate receive path 6b and the separator receive path 16b define a "receive path" according to a preferred embodiment of the present invention that connects the receive electrode Rxa and the output terminal of the receive filter circuit 15. The substrate common path 6c and the separator common path 16c define a "common path" according to a preferred embodiment of the present invention that connects the common electrode ANTa and each of the output terminal of the transmit filter circuit 14 and the input terminal of the receive filter circuit 15.

The configurations of the transmit filter circuit 14 and the receive filter circuit 15 will now be described below. In the transmit filter circuit 14, the frequency band of a transmitting signal is set as the pass band. In the receive filter circuit 15, the frequency band of a received signal, which is different from the frequency band of a transmitting signal, is set as the pass band.

The transmit SAW filter device 14a of the transmit filter circuit 14 outputs an unbalanced transmitting signal in a first frequency band input from the unbalanced transmit terminal electrode Txb to the common terminal electrode ANTb. As shown in FIGS. 1, 3A, and 3B, the transmit SAW filter device 14a is located in a region A on the main surface 11a by ladder-connecting resonators having interdigital electrodes and reflectors. The region A is one of the regions obtained by dividing the main surface 11a with an imaginary line perpendicular to a pair of opposing sides of the device substrate 11 and passing through the common terminal electrode ANTb. More specifically, the transmit filter circuit 14 includes plural (for example, ten in this preferred embodiment) resonators S1 through S10 and plural (for example, seven in this preferred embodiment) parallel arm resonators P1 through P7. The resonators S1 through S10 are disposed on a series arm connecting the input terminal and the output terminal of the transmit filter circuit 14. The parallel arm resonators P1 through P7 are connected between the series arm and the ground terminal electrodes GNDb.

The parallel arm resonator P1 is connected at one end between the series arm resonators S2 and S3 and at the other end to the ground terminal electrode GNDb via the separator ground path 16d. One end of the inductor L1 is connected to the other end of the parallel arm resonator P1 via the ground terminal electrode GNDb, and the other end of the inductor L1 is connected to the ground electrode GNDa via the substrate ground path 6d. With this configuration, the parallel arm resonator P1 is connected to the ground electrode GNDa.

The parallel arm resonator P2 is connected at one end between the series arm resonators S4 and S5 and at the other end to one end of the parallel arm resonator P3. The other end of the parallel arm resonator P3 is connected to the ground terminal electrode GNDb via the separator ground path 16d. One end of the inductor L2 is connected to the other end of the resonator P3 via the ground terminal electrode GNDb, and the other end of the inductor L2 is connected to the ground electrode GNDa via the substrate ground path 6d. With this configuration, the parallel arm resonators P2 and P3 are connected to the ground electrode GNDa.

The parallel arm resonator P4 is connected at one end between the series arm resonators S6 and S7 and at the other end to one end of the parallel arm resonator P5. The parallel arm resonator P6 is connected at one end between the series arm resonators S7 and S8 and at the other end to one end of the parallel arm resonator P7. The other ends of the parallel arm resonators P5 and P7 are connected to the ground terminal electrode GNDb via the separator ground path 16d. One end of the inductor L3 is connected to the other ends of the resonators P7 and P5 via the ground terminal electrode GNDb, and the other end of the inductor L3 is connected to the ground electrode GNDa via the substrate ground path 6d. With this configuration, the parallel arm resonators P4 through P7 are connected to the ground electrode GNDa.

Suitably adjusting of the inductance values of the inductors L1 through L3 adjusts the attenuation characteristics of the transmit filter circuit 14. More specifically, suitably adjusting of the inductance values of the inductors L1 through L3 is able to provide an attenuation pole at a position of a certain frequency on the lower side or the higher side of the pass band of the transmit circuit 14. The resonators S1 through S10 and P1 through P7 are preferably provided disposing reflectors at both sides of each interdigital electrode in the propagating direction of surface acoustic waves.

The receive SAW filter device 15a of the receive filter circuit 15 outputs an unbalanced received signal in a second frequency band input into the common terminal electrode ANTb to the receive terminal electrode Rxb. As shown in FIGS. 1, 3A, and 3B, the receive filter circuit 15 is provided in a region B on the main surface 11a by connecting plural resonators having interdigital electrodes and reflectors. The region B is the other one of the regions obtained by dividing the main surface 11a with the imaginary line perpendicular to a pair of opposing sides of the device substrate 11 and passing through the common terminal electrode ANTb. The configuration of the receive filter circuit 15 is preferably the same as that of the transmit filter circuit 14, and a detailed explanation thereof will thus be omitted.

The receive filter circuit 15 may be provided as a balanced filter circuit that includes two receive terminal electrodes Rxb and outputs a received signal in a balanced state.

In this preferred embodiment, the inductors L1 through L3 that adjust the characteristics of the transmit filter circuit 14 of the separator 10 are defined by the wiring electrodes 4 in the module substrate 2. As shown in FIG. 2, the wiring electrode 4 defining the inductor L1 is located right under the separator 10 without a shielding ground electrode disposed between the wiring electrode 4 defining the inductor L1 and the separator 10, as viewed from above.

As shown in FIG. 3A and FIG. 3B, the wiring electrode 4 defining the inductor L1 overlaps or is adjacent to at least the separator common path 16c within the separator 10, as viewed from above. That is, in this preferred embodiment, when an RF signal flows through the signal path of the radio-frequency module 1, the inductor L1 connected in series between the parallel arm resonator P1 and the ground electrode GNDa is connected to the separator common path 16c in a radio-frequency range due to magnetic-field coupling and/or electric-field coupling, as indicated by the regions surrounded by the one-dot-chain lines in FIGS. 1, 3A, and 3B. This provides a propagation path WP connected to the signal path (separator common path 16c) at the output terminal of the transmit filter circuit 14.

The degree of electromagnetic coupling which defines the propagation path WP is adjusted so that the phase of an RF signal outside the frequency band of a transmitting signal passing through the propagation path WP is the opposite to the phase of an RF signal outside the frequency band of a transmitting signal passing through the transmit filter circuit 14 and so that the amplitudes of the two RF signals will be the same or substantially the same.

More specifically, for example, if the amplitude of a transmitting signal flowing to the separator common path 16c via the transmit filter circuit 14 and the amplitude of a transmitting signal flowing to the separator common path 16 via the propagation path WP are the same and if the phases of the two signals are different by 180°, the two signals completely cancel each other out. However, due to designing and manufacturing variations and tolerances, the phase difference between the two signals may not be 180°, or the amplitudes of the two signals may not be exactly the same. Even in this case, however, if the phase difference between the two signals is substantially 180°, advantages similar to those when the phase difference between the two signals is exactly 180° are able to be obtained. If the amplitudes of the two signals are the same or substantially the same, advantages similar to those when the amplitudes of the two signals are exactly the same are able to be obtained.

Isolation characteristics of the separator 10 will now be described below with reference to FIG. 4. The isolation characteristics shown in FIG. 4 indicate the magnitude of an RF signal observed at the receive electrode Rxa (receive terminal electrode Rxb) when an RF signal of a certain frequency in the frequency band of a received signal is input into the transmit electrode Txa (transmit terminal electrode Txb). In FIG. 4, the horizontal axis indicates the frequency (MHz) of an RF signal input into the transmit electrode Txa, while the vertical axis indicates the signal level (dB) of the RF signal observed at the receive electrode Rxb.

The solid line in FIG. 4 indicates isolation characteristics observed when a predetermined RF signal is input into the radio-frequency module 1 including the propagation path WP defined by electromagnetic coupling as described above. The dotted line in FIG. 4 indicates isolation characteristics of a comparative example observed when a predetermined RF signal is input into a radio-frequency module without a propagation path WP.

As shown in FIG. 4, in comparison with the comparative example, the isolation characteristics in the frequency band of a received signal (for example, approximately 2100 MHz to 2170 MHz in this preferred embodiment) are improved by about 4 dB, for example.

As described above, in this preferred embodiment, the matching circuit 3 is connected to the substrate common path 6c which connects the common electrode ANTa and the common terminal electrode ANTb of the separator 10. One end of each of the inductors L1 through L3 that adjust the characteristics of the transmit filter circuit 14 is connected to the transmit filter circuit 14 and the other ends of the inductors L1 through L3 are connected to the ground electrode GNDa. The inductor L1 is disposed so that the inductor L1 connected to the transmit filter circuit 14 and the separator common path 16c connected to the output terminal of the transmit filter circuit 14 are able to be connected with each other in a radio-frequency range due to magnetic-field coupling and/or electric-field coupling. This defines a propagation path WP connected to the signal path (separator common path 16c) at the output terminal of the transmit filter circuit 14. With this configuration, RF signals including a transmitting signal input into the transmit electrode Txa pass through the transmit filter circuit 14 and the propagation path WP, and are then combined in the signal path at the output terminal of the transmit filter circuit 14 connected to the propagation path WP.

The degree of magnetic-field coupling and/or electric-field coupling that define the propagation path WP, which is diverted from the transmit filter circuit 14, is adjusted so that at least the phase characteristics of an RF signal outside the frequency band of a transmitting signal which passes through the propagation path WP will differ from those of an RF signal outside the frequency band of a transmitting signal which passes through the transmit filter circuit 14.

The expression "at least the phase characteristics of an RF signal outside the frequency band of a transmitting signal which passes through the propagation path WP differs from those of an RF signal outside the frequency band of a transmitting signal which passes through the transmit filter circuit 14" refers to the fact that, for example, the amplitudes of these signals are the same and the phases of these signals differ by 180°. However, the phase difference between the two signals may not be 180°, or the amplitudes of the two signals may not be exactly the same. Even in this case, if the phase difference between the two signals is substantially 180°, advantages similar to those when the phase difference between the two signals is exactly 180° are able to be obtained. If the amplitudes of the two signals are substantially the same, advantages similar to those when the amplitudes of the two signals are exactly the same can be obtained. As a result, the RF signal outside the frequency band of a transmitting signal which passes through the transmit filter circuit 14 and the RF signal outside the frequency band of a transmitting signal which passes through the propagation path WP cancel each other out and are attenuated when they are combined.

In comparison with a known configuration in which circuit devices such as an inductor and a capacitor are added to define a correction circuit, the propagation path WP to improve the filter characteristics are able to be provided a simple configuration by using components of a known filter circuit. It is thus possible to improve attenuation characteristics for an RF signal outside the frequency band of a transmitting signal without increasing the size of the radio-frequency module 1. It is also possible to reduce the possibility that an RF signal of a frequency band which is outside the frequency band of a transmitting signal and which is the same or substantially the same as the frequency band of a received signal will enter the receive filter circuit 15 from the signal path at the output terminal of the transmit filter circuit 14 and be output from the receive electrode Rxa. This enhances isolation characteristics between the transmit filter circuit 14 and the receive filter circuit 15.

More specifically, for example, the attenuation characteristics for an RF signal including harmonics outside the pass band of the transmit filter circuit 14 are improved. The degree of electromagnetic coupling which defines a propagation path WP is adjusted so that, if an RF signal including second or third harmonics of a transmitting signal flows through the transmit filter circuit 14, an RF signal out of phase with the RF signal including second or third harmonics by about 180° will flow through the propagation path WP. Thus, the RF signal including harmonics which passes through the transmit filter circuit 14 and the RF signal including harmonics in opposite phase which passes through the propagation path WP cancel each other out. As a result, the attenuation characteristics for an RF signal including harmonics of a transmitting signal in the transmit filter circuit 14 are able to be improved.

If an RF signal in the frequency band of a received signal flows through the transmit filter circuit 14, this RF signal, which is a signal outside the frequency band of a transmitting signal, is canceled as described above. This improves attenuation characteristics for an RF signal in the frequency band of a received signal in the transmit filter circuit 14. It is thus possible to reduce the possibility that an RF signal in the frequency band of a received signal will pass through the transmit filter circuit 14 and enter the signal path of the receive filter circuit 15. As a result, isolation characteristics between the transmit filter circuit 14 and the receive filter circuit 15 are able to be improved.

The degree of electric-field coupling and/or magnetic-field coupling that define a propagation path WP are able to be adjusted by moving the position of the inductor L1 connected in series between the parallel arm resonator P1 and the ground electrode GNDa, such as by changing the distance between the inductor L1 and a signal path to be electromagnetically coupled with the inductor L1. Basically, each of the degree of electric-field coupling (capacitive coupling) and that of magnetic-field coupling (inductive coupling) that define a propagation path WP is set in accordance with the frequency band to be mainly attenuated, such as that of harmonic components and an RF signal in the same frequency band as a received signal contained in an RF signal input into the transmit electrode Txa.

As viewed from above, no shielding ground electrode is disposed between the separator 10 and the wiring electrode 4 defining the inductor L1 disposed under the separator 10. This achieves reliable electromagnetic coupling between the inductor L1 provided in the module substrate 2 and the separator common path 16c, the separator receive path 16b, and the receive filter circuit 15 disposed within the separator 10.

In this preferred embodiment, the wiring electrode 4 defining the inductor L1 is disposed such that it overlaps or is adjacent to at least the separator common path 16c within the separator 10, as viewed from above. This configuration makes it possible to electromagnetically couple the separator common path 16c within the separator 10 and the inductor L1 provided in the module substrate 2, and thus to connect the resulting propagation path WP to the separator common path 16c. Thus, immediately after an RF signal outside the frequency band of a transmitting signal is output from the output terminal of the transmit circuit filter 14, the RF signal is able to be suppressed and attenuated in the separator common path 16c. This further improves isolation characteristics between the transmit filter circuit 14 and the receive filter circuit 15.

The inductors L1 through L3 connected to the parallel arm resonators P1 through P7 which are shunt-connected to the series arm of the resonators S1 through S10 effectively adjust the attenuation characteristics of the ladder transmit filter circuit 14 utilizing elastic waves.

The insulating layer 12 surrounds a predetermined region of the main surface 11a of the device substrate 11 where the series arm resonators S1 through S10 and the parallel arm resonators P1 through P7 defining the transmit filter circuit 14 and the resonators defining the receive filter circuit 15 are disposed. The cover layer 13 is laid on the insulating layer 12 so as to define a space surrounded by the insulating layer 12 between the cover layer 13 and the device substrate 11. With this configuration, the radio-frequency module 1 in which the separator 10 with a wafer-level packaging (WLP) structure is mounted on the module substrate 2 is able to be provided.

Second Preferred Embodiment

Figure 5A:
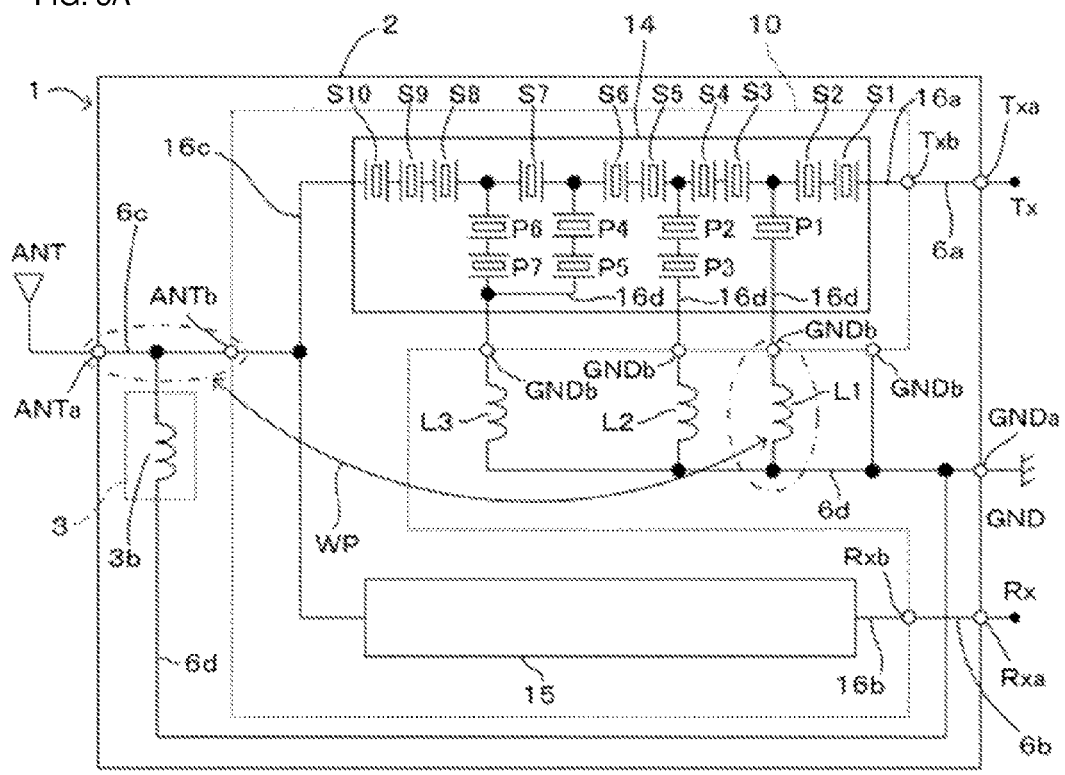
FIG. 5A is a circuit block diagram illustrating an electrical configuration of a radio-frequency module according to a preferred embodiment of the present invention.
Figure 5B:
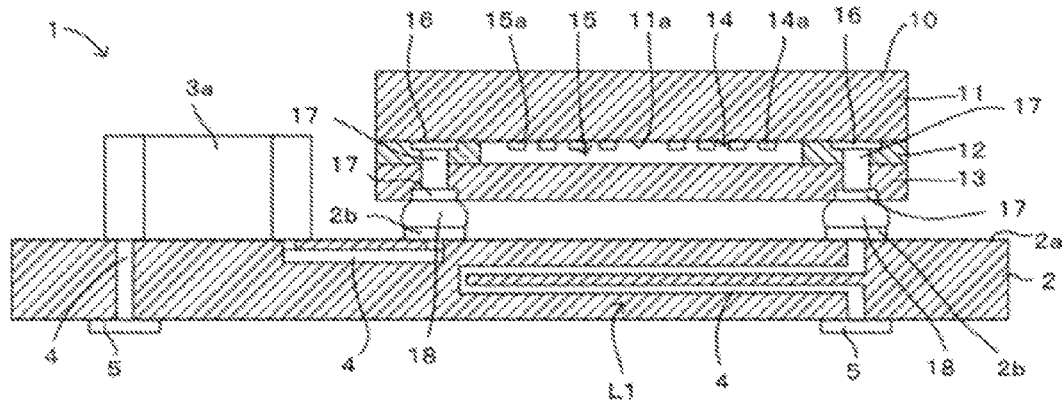
FIG. 5B is a sectional view of the structure of the radio-frequency module according to a preferred embodiment of the present invention.
Figure 5C:
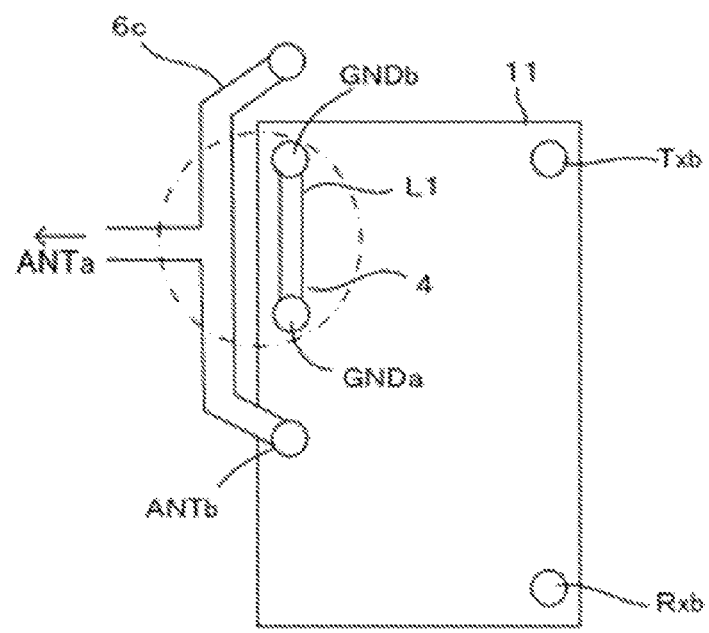
FIG. 5C is a plan view of the radio-frequency module according to a preferred embodiment of the present invention.

A second preferred embodiment of the present invention will be described below with reference to FIG. 5A through FIG. 5C. FIG. 5A, FIG. 5B, and FIG. 5C illustrate the second preferred embodiment of a radio-frequency module of the present invention. FIG. 5A is a circuit block diagram illustrating the electrical configuration of a radio-frequency module according to the second preferred embodiment of the present invention. FIG. 5B is a sectional view of the structure of the radio-frequency module according to the second preferred embodiment. FIG. 5C is a plan view of the radio-frequency module according to the second preferred embodiment.

This preferred embodiment differs from the first preferred embodiment in that magnetic-field coupling and/or electric-field coupling are established between the wiring electrode 4 defining the inductor L1 and the wiring electrode 4 defining the substrate common path 6c, as shown in FIG. 5A. The configuration of the other elements is similar to that of the first preferred embodiment, and the other elements are designated by like reference numerals and an explanation thereof will thus be omitted.

As shown in FIG. 5B, the wiring electrode 4 defining the inductor L1 is located adjacent to the wiring electrode 4 defining the substrate common path 6c, as viewed from above. As shown in FIG. 5C, the wiring electrode 4 defining the inductor L1 is located adjacent to the wiring electrode 4 defining the substrate common path 6c, as viewed from above. The expression "located adjacent to" refers to that the wiring electrode 4 defining the inductor L1 and the wiring electrode 4 defining the substrate common path 6c are separated from each other by a distance by which magnetic-field coupling and/or electric-field coupling is established therebetween. As shown in FIG. 5B, the wiring electrode 4 defining the inductor L1 and the wiring electrode 4 defining the substrate common path 6c may be disposed on different dielectric layers or on the same dielectric layer among plural dielectric layers defining the module substrate 2, as viewed from above.

Third Preferred Embodiment

Figure 6:
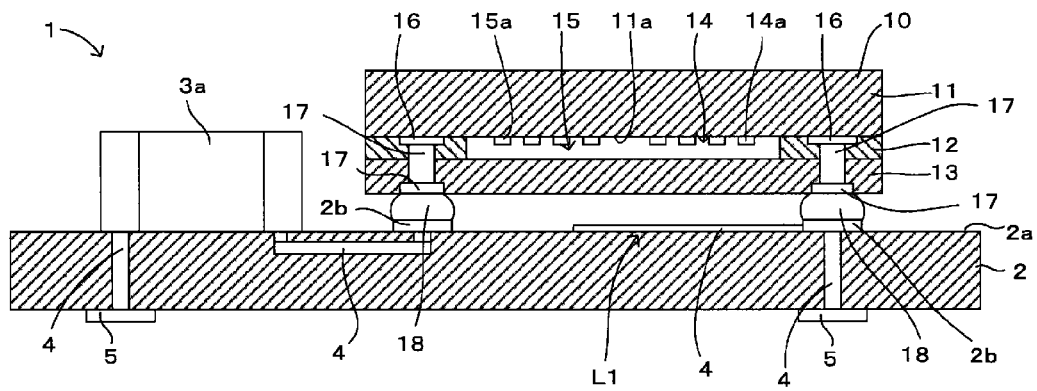
FIG. 6 illustrates a radio-frequency module according to a preferred embodiment of the present invention.

A third preferred embodiment of the present invention will be described below with reference to FIG. 6. FIG. 6 illustrates the third preferred embodiment of a radio-frequency module of the present invention.

This preferred embodiment differs from the first preferred embodiment in that the wiring electrode 4 defining the inductor L1 is disposed on the mounting surface 2a of the module substrate 2, as shown in FIG. 6. The configuration of the other elements is similar to that of the first preferred embodiment, and the other elements are designated by like reference numerals and an explanation thereof will thus be omitted.

In this preferred embodiment, the wiring electrode 4 defining the inductor L1 is disposed on the mounting surface 2a of the module substrate 2, and is thus closer to the separator 10. This achieves more reliable electromagnetic coupling between the inductor L1 provided on the module substrate 2 and the separator common path 16c, the separator receive path 16b, and the receive filter circuit 15 disposed within the separator 10.

Fourth Preferred Embodiment

Figure 7:
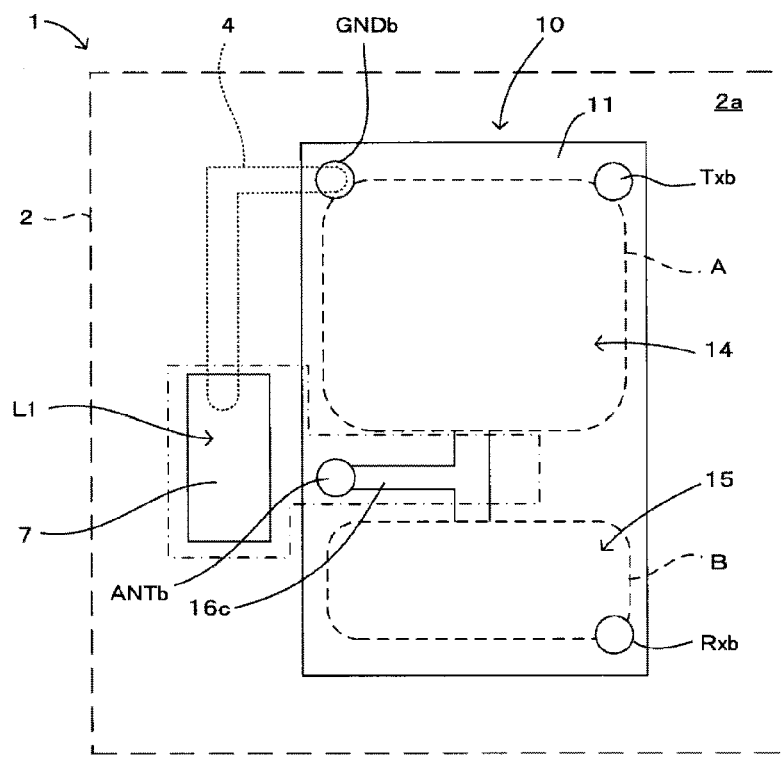
FIG. 7 is a plan view illustrating the positional relationship between a common path provided within a separator of a radio-frequency module according to a preferred embodiment of the present invention and an inductor provided on a module substrate.

A fourth preferred embodiment of the present invention will be described below with reference to FIG. 7. FIG. 7 is a plan view illustrating the positional relationship between a common path provided within a separator of a radio-frequency module according to the fourth preferred embodiment and an inductor provided on a module substrate.

This preferred embodiment differs from the first preferred embodiment in that the inductor L1 is defined by a chip inductor component 7 and is mounted on the mounting surface 2a of the module substrate 2 such that it is disposed adjacent to the common terminal electrode ANTb of the separator 10, as shown in FIG. 7. The configuration of the other elements is similar to that of the first preferred embodiment, and the other elements are designated by like reference numerals and an explanation thereof will thus be omitted.

In this preferred embodiment, the inductor component 7 defining the inductor L1 is disposed adjacent to the common terminal electrode ANTb of the separator 10. This configuration makes it possible to electromagnetically couple the inductor L1 with the separator common path 16c connected to the common terminal electrode ANTb within the separator 10, as indicated by the region surrounded by the one-dot-chain lines. Additionally, the inductor L1 is defined by the chip inductor component 7, which enables easier and more precise adjustment of the inductance of the inductor L1 than that of the inductor L1 defined by the wiring electrode 4 provided in or on the module substrate 2. It is thus possible to more easily and more precisely adjust the attenuation characteristics of the transmit filter circuit 14 and the degree of electromagnetic coupling that defines a propagation path WP to attenuate an RF signal outside the frequency band of a transmitting signal.

Fifth Preferred Embodiment

Figure 8:
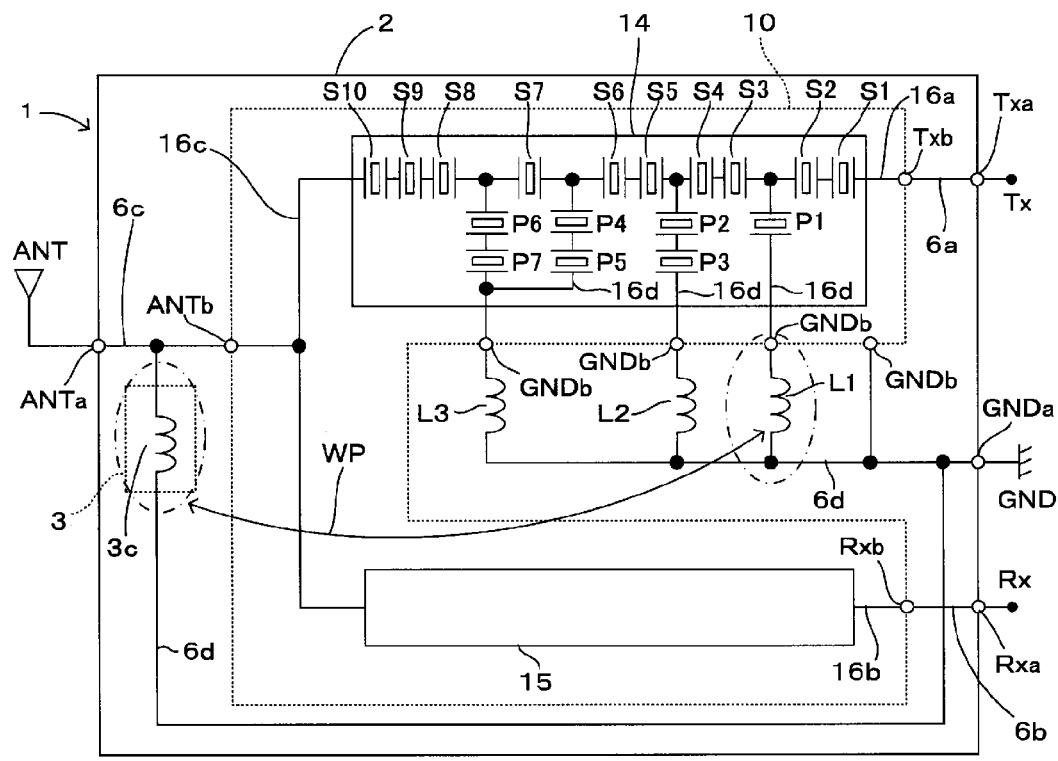
FIG. 8 is a circuit block diagram illustrating the electrical configuration of a radio-frequency module according to a fifth preferred embodiment of the present invention.
Figure 9:
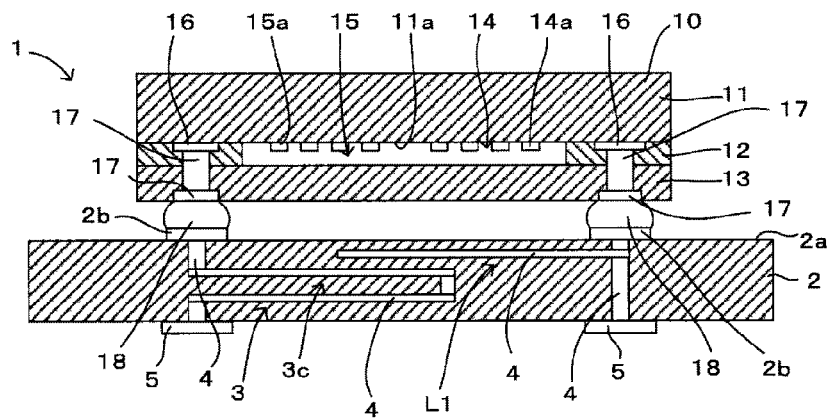
FIG. 9 illustrates an example of a sectional view of the structure of the radio-frequency module according to a preferred embodiment of the present invention.
Figure 10:
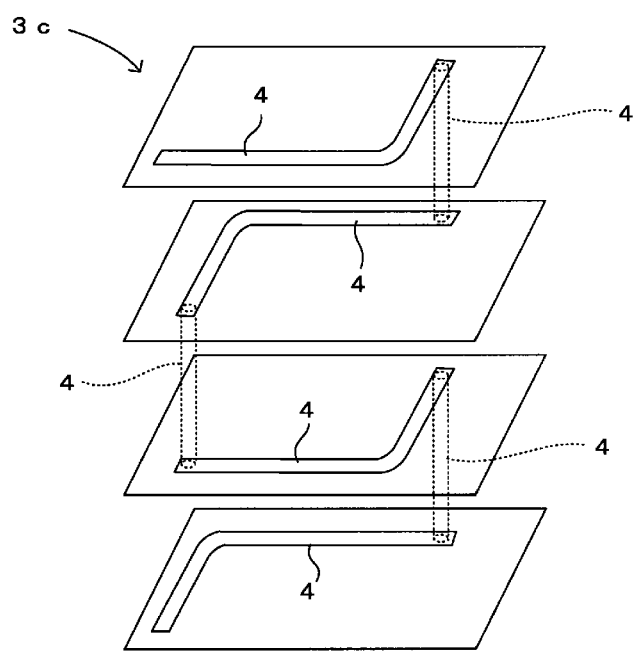
FIG. 10 is a schematic view illustrating the configuration of wiring electrodes included in a matching circuit provided in a module substrate according to a preferred embodiment of the present invention.
Figure 11A:
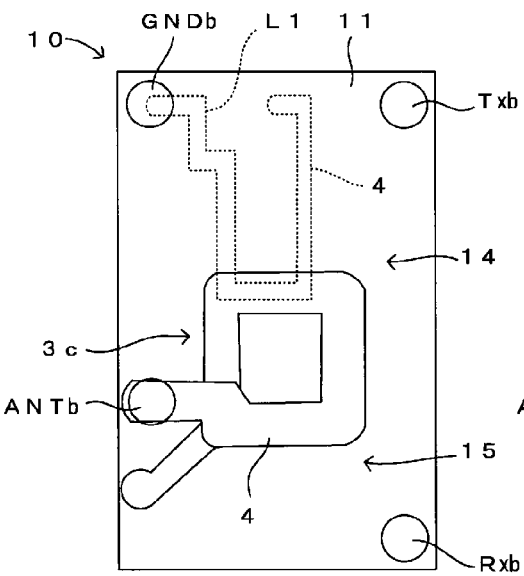
Figure 11B:
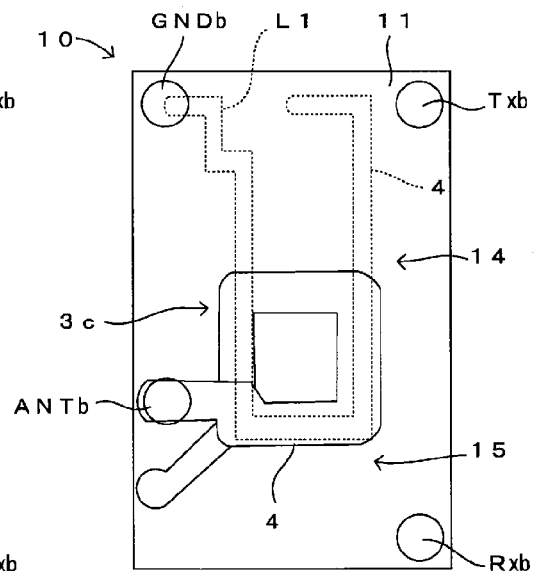
Figure 11C:
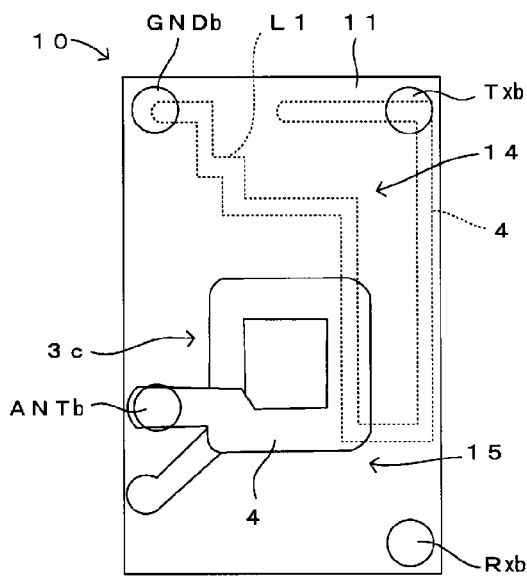

A fifth preferred embodiment of the present invention will be described below with reference to FIGS. 8 through 11. FIG. 8 is a circuit block diagram of a radio-frequency module according to the fifth preferred embodiment. FIG. 9 is a sectional view of the structure of the radio-frequency module shown in FIG. 8. FIG. 10 is a schematic view illustrating the configuration of wiring electrodes defining a matching circuit provided in a module substrate. FIG. 11 illustrates the positional relationships between the matching circuit and the inductor provided in the module substrate and a separator. FIG. 11A through FIG. 11C illustrate different positional relationships.

This preferred embodiment differs from the first preferred embodiment in that the matching circuit 3 is defined by an inductor 3c including a wiring electrode 4 provided in the module substrate 4, as shown in FIGS. 8 and 9. The wiring electrode 4 defining the inductor 3c of the matching circuit 3 is located right under the separator 10, as viewed from above, such that it overlaps the wiring electrode 4 defining the inductor L1, as viewed from above. When a transmitting signal is input into the transmit electrode Txa, the inductor L1 that adjust the characteristics of the transmit circuit 14 is connected to the inductor 3c of the matching circuit 3 in a radio-frequency range due to electromagnetic coupling therebetween, thus providing a propagation path WP. The configuration of the other elements is similar to that of the first preferred embodiment, and the other elements are designated by like reference numerals and an explanation thereof will thus be omitted.

The inductor 3c which defines the matching circuit 3 is provided, for example, as shown in FIG. 10. The inductor 3c includes plural L-shaped or substantially L-shaped in-planar conductor patterns (wiring electrodes 4) on the plural respective dielectric layers of the module substrate 2. The L-shaped or substantially L-shaped in-planar conductor patterns on the first and third layers from the top are disposed in the same orientation, and the L-shaped or substantially L-shaped in-planar conductor patterns on the second and fourth layers from the top are disposed in an orientation in which the in-planar conductor patterns on the first and third layers are rotated by about 180°. One end on a short side of the in-planar conductor pattern on the first layer is connected to the other end on a long side of the in-planar conductor pattern on the second layer by using a via-conductor (wiring electrode 4). One end on a short side of the in-planar conductor pattern on the second layer is connected to the other end on a long side of the in-planar conductor pattern on the third layer by using a via-conductor. One end on a short side of the in-planar conductor pattern on the third layer is connected to the other end on a long side of the in-planar conductor pattern on the fourth layer by using a via-conductor. With this configuration, the spiral inductor 3c is provided.

As shown in FIG. 11A through FIG. 11C, for example, the wiring electrode 4 defining the inductor 3c and the wiring electrode 4 defining the inductor L1 are disposed such that they overlap each other as viewed from above. In the example in FIG. 11A, the wiring electrode 4 defining the inductor L1 is disposed such that it overlaps the wiring electrode 4 defining the inductor 3c at the central position of the device substrate 11 of the separator 10. In the example in FIG. 11B, the wiring electrode 4 defining the inductor L1 preferably has a ring shape such that it overlaps the substantially entire periphery of the wiring electrode 4 defining the inductor 3c, as viewed from above. In the example in FIG. 11C, the wiring electrode 4 defining the inductor L1 is disposed such that it overlaps the wiring electrode 4 defining the inductor 3c at a position separated from the common terminal electrode ANTb.

As described above, in this preferred embodiment, the wiring electrode 4 defining the matching circuit 3 (inductor 3c) and the wiring electrode 4 defining the inductor L1 are disposed such that they overlap each other in the module substrate 2 as viewed from above. This configuration makes it possible to electromagnetically couple the matching circuit 3 and the inductor L1. The matching circuit 3 is defined by a wiring electrode 4 provided in the module substrate 2, so that it is able to be disposed under the separator 10. This configuration reduces the size of the module substrate 2, compared with a module substrate on which a matching circuit 3 defined by a chip component is mounted near the separator 10. The size of the radio-frequency module 1 is able to be reduced accordingly.

The wiring electrode 4 defining the inductor L1 and the wiring electrode 4 defining the inductor 3c of the matching circuit 3 may be provided in the module substrate 2 such that they overlap each other in a region outside the separator 10 as viewed from above.

Sixth Preferred Embodiment

Figure 12:
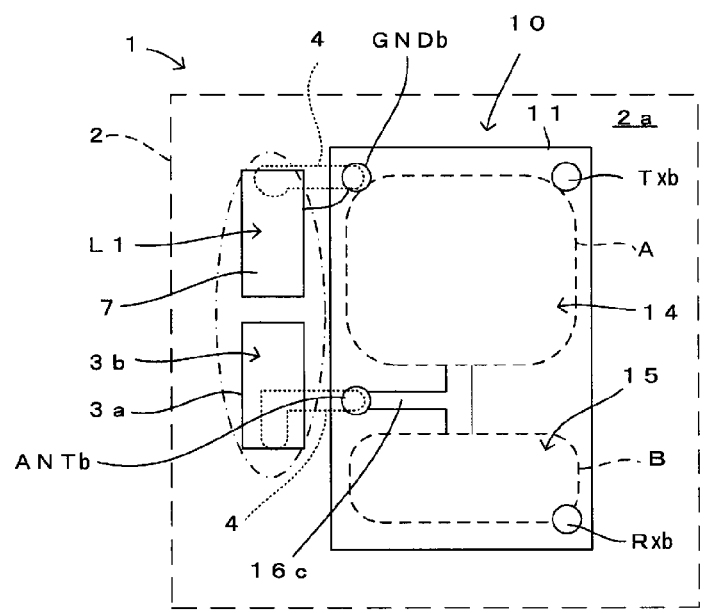
FIG. 12 is a plan view illustrating a positional relationship between an inductor and a matching circuit disposed near a separator of a radio-frequency module according to a preferred embodiment of the present invention.

A sixth preferred embodiment of the present invention will be described below with reference to FIG. 12. FIG. 12 is a plan view illustrating the positional relationship between an inductor and a matching circuit disposed near a separator of a radio-frequency module according to the sixth preferred embodiment of the present invention.

This preferred embodiment differs from the first preferred embodiment in that a chip inductor component 7 defining the inductor L1 and a chip circuit component 3a including a built-in inductor 3b defining the matching circuit 3 are mounted on the mounting surface 2a of the module substrate 2 and are disposed adjacent to each other, as shown in FIG. 12. No components are disposed between the inductor component 7 and the circuit component 3a as viewed from above. The configuration of the other elements is similar to that of the first preferred embodiment, and the other elements are designated by like reference numerals and an explanation thereof will thus be omitted.

In this preferred embodiment, the inductor component 7 defining the inductor L1 and the circuit component 3a defining the matching circuit 3 are disposed adjacent to each other, so that the matching circuit 3 and the inductor L1 are able to be electromagnetically coupled with each other.

Additionally, the inductor L1 is defined by the chip inductor component 7, which enables easier and more precise adjustment of the inductance of the inductor L1 than that of the inductor L1 defined by the wiring electrode 4 provided in or on the module substrate 2. The matching circuit 3 is defined by the chip circuit component 3a, which enables easier and more precise adjustment of the impedance characteristics of the matching circuit 3 than that of a matching circuit 3 defined by the wiring electrode 4 provided in or on the module substrate 2. It is thus possible to more easily and more precisely adjust the attenuation characteristics of the transmit filter circuit 14 and the degree of electromagnetic coupling that defines a propagation path WP to attenuate an RF signal outside the frequency band of a transmitting signal.

Seventh Preferred Embodiment

Figure 13:
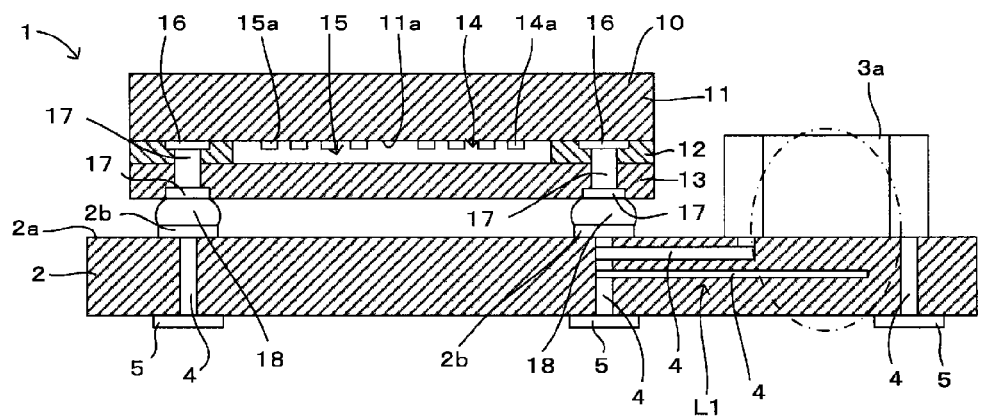
FIG. 13 illustrates a preferred embodiment of a radio-frequency module of the present invention.

A seventh preferred embodiment of the present invention will be described below with reference to FIG. 13. FIG. 13 illustrates the seventh preferred embodiment of a radio-frequency module of the present invention.

This preferred embodiment differs from the first preferred embodiment in that, as shown in FIG. 13, the circuit component 3a defining the matching circuit 3 and the wiring electrode 4 defining the inductor L1 are disposed such that they overlap each other in a region outside the device substrate 11 of the separator 10, as viewed from above. The configuration of the other elements is similar to that of the first preferred embodiment, and the other elements are designated by like reference numerals and an explanation thereof will thus be omitted.

In this preferred embodiment, the wiring electrode 4 defining the inductor L1 provided in the module substrate 2 and the circuit component 3a defining the matching circuit 3 mounted on the mounting surface 2a of the module substrate 2 are disposed such that they overlap each other as viewed from above in the region surrounded by the one-dot-chain lines in FIG. 13. This configuration makes it possible to electromagnetically couple the inductor L1 and the matching circuit 3 with each other.

In the radio-frequency module 1 shown in FIG. 13, instead of the inductor L1, the matching circuit 3 may include the wiring electrode 4 provided in the module substrate 2, and instead of the circuit component 3a, the chip inductor component defining the inductor L1 may be mounted on the mounting surface 2a of the module substrate 2. Then, the wiring electrode 4 defining the matching circuit 3 and the inductor component 7 may be disposed such that they overlap each other as viewed from above. With this arrangement, the wiring electrode 4 defining the matching circuit 3 provided in the module substrate 2 and the inductor component 7 defining the inductor L1 mounted on the mounting surface 2a of the module substrate 2 are disposed such that they overlap each other as viewed from above in the region surrounded by the one-dot-chain lines in FIG. 13. This configuration makes it possible to electromagnetically couple the inductor L1 and the matching circuit 3 with each other.

Eighth Preferred Embodiment

Figure 14:
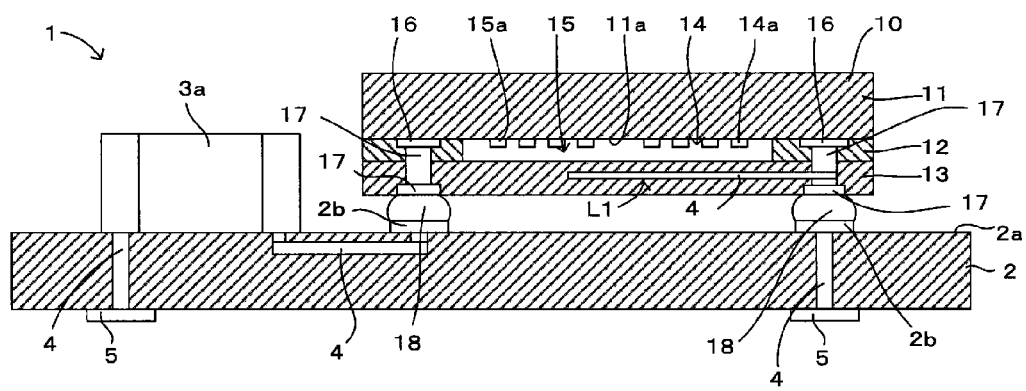
FIG. 14 illustrates a preferred embodiment of a radio-frequency module of the present invention.
Figure 15:
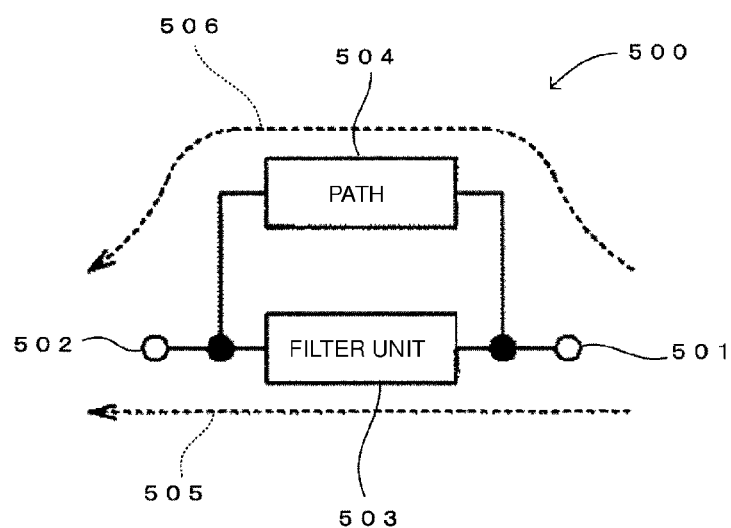
FIG. 15 illustrates a filter circuit provided in a known radio-frequency module.

An eighth preferred embodiment of the present invention will be described below with reference to FIG. 14. FIG. 14 illustrates the eighth preferred embodiment of a radio-frequency module of the present invention.

This preferred embodiment differs from the first preferred embodiment in that the inductor L1 is defined by a wiring electrode 4 provided in or on the cover layer 13 of the separator 10, as shown in FIG. 14. The configuration of the other elements is similar to that of the first preferred embodiment, and the other elements are designated by like reference numerals and an explanation thereof will thus be omitted.

In this preferred embodiment, the inductor L1 is defined by the wiring electrode 4 provided in or on the cover layer 13 of the separator 10. The inductor L1 is thus able to be located more closely to the separator common path 16c, the separator receive path 16b, and the receive filter circuit 15 disposed within the separator 10. This achieves more reliable electromagnetic coupling between the inductor L1 and the separator common path 16c, the separator receive path 16b, and the receive filter circuit 15 disposed within the separator 10 so that a propagation path WP is able to be provided.

The present invention is not restricted to the above-described preferred embodiments. Various modifications may be made to the preferred embodiments and the configurations of the preferred embodiments may be combined in any manner without departing from the spirit of the present invention. For example, in the above-described preferred embodiments, the inductor L1 that adjusts the characteristics of the transmit filter circuit is basically connected to the separator common path 16c or the matching circuit 3 in a radio-frequency range. However, a propagation path WP may be provided by connecting the inductor L1 to the receive filter circuit 15 or the separator receive path 16b in a radio-frequency range. Additionally, it is sufficient if the degree of electromagnetic coupling that defines a propagation path WP is adjusted so that at least the phase characteristics of an RF signal outside the frequency band of a transmitting signal which passes through the propagation path WP will be different from those of an RF signal outside the frequency band of a transmitting signal which passes through the transmit filter circuit 14.

The configuration of the ladder filter of the transmit filter circuit 14 is not restricted to the above-described example. Any type of transmit filter circuit 14 including shunt-connected resonators that adjust the filter characteristics may be used. Concerning the configuration of the receive filter circuit 15, a receive filter circuit 15 including resonators utilizing elastic waves may be used. Alternatively, a receive filter circuit 15 defined by a typical LC filter may be used. The filter utilizing elastic waves is not restricted to a SAW filter. BAW filters utilizing bulk acoustic waves, such as FBAR or SMR filters, may be used to provide the transmit filter circuit 14 and the receive filter circuit 15.

The configuration of the separator 10 is not restricted to the above-described WLP structure. The separator may include the so-called CSP structure having a package substrate. Without providing the cover layer 13, the separator with a bare chip structure may be directly mounted on the mounting surface 2a of the module substrate 2.

In the above-described preferred embodiments, the radio-frequency module 1 including one separator 10 mounted on the module substrate 2 has been discussed as an example. However, the radio-frequency module 1 may include two or more separators 10 mounted on the module substrate 2. In this case, a switch IC is provided on the module substrate 2 and selects a separator 10 to be used among plural separators 10 mounted on the module substrate 2.

In the above-described preferred embodiments, the transmit filter circuit 14 and the receive filter circuit 15 are preferably located in the same space. However, two spaces surrounded by the insulating layer 12 may be provided between the device substrate 11 and the cover layer 13, and the transmit filter circuit 14 and the receive filter circuit 15 may be disposed in the respective spaces. With this structure, the transmit filter circuit 14 and the receive filter circuit 15 are physically separated from each other. It is thus possible to reduce the influence of heat generated by applying power to the transmit filter circuit 14 on the characteristics of the receive filter circuit 15 and also to further improve isolation characteristics between the transmit filter circuit 14 and the receive filter circuit 15.

In the above-described preferred embodiments, the propagation path WP is provided preferably by connecting the inductor L1 that adjust the characteristics of the transmit filter circuit 14 to the circuit devices connected to the output terminal of the transmit filter circuit 14 in a radio-frequency range. However, instead of the inductor L1, the inductor L2 or L3 may be used to provide the propagation path WP. Alternatively, plural inductors may be connected to the signal path at the output side of the transmit filter circuit 14 in a radio-frequency range.

Preferred embodiments of the present invention are widely applicable to a radio-frequency module having a function of separating a transmitting signal and a received signal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module comprising:
a transmit electrode into which a transmitting signal is input;
a common electrode from which the transmitting signal is output and into which a received signal is input;
a receive electrode from which the received signal is output;
a separator including a transmit filter circuit and a receive filter circuit, a frequency band of the transmitting signal being set in the transmit filter circuit as a pass band, a frequency band of the received signal being set in the receive filter circuit as a pass band, the frequency band of the received signal being different from the frequency band of the transmitting signal;
a transmit path that connects the transmit electrode and an input terminal of the transmit filter circuit;
a receive path that connects the receive electrode and an output terminal of the receive filter circuit;
a common path that connects the common electrode and each of an output terminal of the transmit filter circuit and an input terminal of the receive filter circuit;
a matching circuit connected to the common path; and
an inductor that adjusts characteristics of the transmit filter circuit, one end of the inductor being connected to the transmit filter circuit, the other end of the inductor being connected to a ground electrode; wherein
the inductor and at least one of the common path, the matching circuit, the receive filter circuit, and the receive path define a propagation path connected to a signal path at the output terminal of the transmit filter circuit due to magnetic-field coupling and/or electric-field coupling;
the transmit filter circuit includes a plurality of series arm resonators on a series arm connected between the input terminal and the output terminal of the transmit filter circuit and a plurality of parallel arm resonators connected between the plurality of series arm resonators and a ground terminal electrode;
the one end of the inductor is connected to the transmit filter circuit with the ground terminal electrode therebetween; and the inductor is connected in series to one of the plurality of parallel arm resonators.

2. The radio-frequency module according to claim 1, further comprising:
a module substrate on which the transmit electrode, the receive electrode, and the common electrode are disposed, on or in which the matching circuit are disposed, and on which the separator is mounted; wherein
the inductor is defined by a wiring electrode provided in or on the module substrate, and the wiring electrode defining the inductor is disposed right under the separator without the ground electrode being disposed between the wiring electrode and the separator, as viewed from above.

3. The radio-frequency module according to claim 2, wherein the wiring electrode defining the inductor is disposed on a mounting surface of the module substrate.

4. The radio-frequency module according to claim 2, wherein the wiring electrode defining the inductor is disposed so as to overlap or be adjacent to at least the common path within the separator as viewed from above.

5. The radio-frequency module according to claim 2, wherein the matching circuit is defined by a wiring electrode provided in or on the module substrate, and the wiring electrode defining the matching circuit overlaps the wiring electrode defining the inductor as viewed from above.

6. The radio-frequency module according to claim 1, further comprising:
a module substrate on which the transmit electrode, the receive electrode, and the common electrode are disposed, on or in which the matching circuit are disposed, and on which the separator is mounted; wherein
the inductor is defined by a chip inductor component, and is mounted on a mounting surface of the module substrate so as to be adjacent to a common terminal electrode of the separator.

7. The radio-frequency module according to claim 1, further comprising:
a module substrate on which the transmit electrode, the receive electrode, and the common electrode are disposed, on or in which the matching circuit are disposed, and on which the separator is mounted; wherein
the inductor is defined by a chip inductor component and is mounted on a mounting surface of the module substrate;
the matching circuit is defined by a chip circuit component and is mounted on the mounting surface of the module substrate; and
the chip inductor component and the chip circuit component are adjacent to each other.

8. The radio-frequency module according to claim 1, further comprising:
a module substrate on which the transmit electrode, the receive electrode, and the common electrode are disposed, on or in which the matching circuit are disposed, and on which the separator is mounted; wherein
the inductor is defined by a wiring electrode provided in or on the module substrate;
the matching circuit is defined by a chip circuit component and is mounted on a mounting surface of the module substrate; and the wiring electrode defining the inductor and the chip circuit component overlap each other as viewed from above.

9. The radio-frequency module according to claim 1, further comprising:
a module substrate on which the transmit electrode, the receive electrode, and the common electrode are disposed, on or in which the matching circuit are disposed, and on which the separator is mounted; wherein
the inductor is defined by a chip inductor component and is mounted on the mounting surface of the module substrate;
the matching circuit is defined by a wiring electrode provided in or on the module substrate; and
the wiring electrode defining the matching circuit and the chip inductor component are disposed so as to overlap each other as viewed from above.

10. The radio-frequency module according to claim 1, wherein the separator includes a cover layer, and the inductor is defined by a wiring electrode provided in or on the cover layer.

11. The radio-frequency module according to claim 1, wherein the separator includes a duplexer.

12. The radio-frequency module according to claim 1, further comprising a module substrate including dielectric layers, and via-conductors and in-planar conductor patterns in or on the dielectric layers.

13. The radio-frequency module according to claim 12, further comprising wiring electrodes and mounting electrodes connected to the in-planar conductor patterns and the via-conductors in or on the dielectric layers to connect the separator, the matching circuit, and electronic components mounted on the module substrate.

14. The radio-frequency module according to claim 12, wherein the in-planar conductor patterns and the via-conductors define capacitors and inductors.

15. The radio-frequency module according to claim 1, wherein the separator has one of a wafer-level packaging structure and a chip-size packaging structure.

16. The radio-frequency module according to claim 1, wherein the magnetic-field coupling and/or the electric-field coupling are established between a wiring electrode defining the inductor and a wiring electrode defining the common path.

17. The radio-frequency module according to claim 1, wherein the inductor is defined by a wiring electrode on a mounting surface of a module substrate.

18. The radio-frequency module according to claim 1, wherein the transmit filter circuit includes shunt-connected resonators and the receive filter circuit includes one of an LC filter and resonators utilizing elastic waves.

19. A communication mobile terminal comprising:
an antenna; and
the radio-frequency module according to claim 1 connected to the antenna.

20. The communication mobile terminal according to claim 19, wherein the communication mobile terminal is one of a cellular phone and a mobile information terminal.

* * * * *